US006606110B2

(12) United States Patent
Gaudiana et al.

(10) Patent No.: US 6,606,110 B2
(45) Date of Patent: Aug. 12, 2003

(54) INTEGRAL ORGANIC LIGHT EMITTING DIODE PRINTHEAD

(75) Inventors: Russell A. Gaudiana, Merrimack, NH (US); Richard G. Egan, Dover, MA (US)

(73) Assignee: Polaroid Corporation, Waltham, MA (US)

( * ) Notice: Subject to any disclaimer, the term of this patent is extended or adjusted under 35 U.S.C. 154(b) by 0 days.

(21) Appl. No.: 09/749,346

(22) Filed: Dec. 27, 2000

(65) Prior Publication Data

US 2002/0118270 A1 Aug. 29, 2002

(51) Int. Cl.[7] .................................................. B41J 2/45
(52) U.S. Cl. ........................................ 347/238; 347/130
(58) Field of Search ................................ 347/130, 238, 347/240, 237, 247, 251, 232; 438/69, 99; 430/383, 391; 445/24

(56) References Cited

U.S. PATENT DOCUMENTS

| 4,602,263 A | 7/1986 | Borror et al. ................ 503/201 |
| 4,715,682 A | 12/1987 | Koek et al. .................. 359/820 |
| 4,720,449 A | 1/1988 | Borror et al. ................ 430/338 |
| 4,720,450 A | 1/1988 | Ellis ........................... 430/339 |
| 4,745,046 A | 5/1988 | Borror et al. ................ 430/332 |
| 4,818,742 A | 4/1989 | Ellis ........................... 503/201 |
| 4,826,976 A | 5/1989 | Borror et al. ................ 544/58.4 |
| 4,839,335 A | 6/1989 | Ellis ........................... 503/224 |
| 4,894,358 A | 1/1990 | Filosa et al. ................. 503/201 |
| 4,960,901 A | 10/1990 | Borror et al. ................ 548/207 |

(List continued on next page.)

FOREIGN PATENT DOCUMENTS

| EP | 0 402 341 | 3/1990 | .......... G06K/15/12 |
| EP | 0 734 078 A2 | 9/1996 | .......... H01L/33/00 |
| EP | 0 887 192 A1 | 12/1998 | .............. B41J/2/45 |
| EP | 0 986 112 A2 | 3/2000 | .......... H01L/51/20 |
| JP | 11320958 | 11/1999 | .............. B41J/2/44 |
| JP | 2000343752 | 12/2000 | .............. B41J/2/44 |

OTHER PUBLICATIONS

S. Forrest, et al., The Dawn of Organic Electronics, IEEE Spec., vol. 37, No. 8, pp. 29–34, Aug. 2000.
Y. Tsuruoka, et al., 40.2: Application of Organic Electroluminescent Device To Color Print; 2000, SID 00 Digest; pp. 978–981.
WIPO Publication, WO 99/36261.
K. Inukai, et al., 36–4L: Late–News Paper: 4.0–in. TFT–OLED Displays and a Novel Digital Driving Method; pp. 924–927, 2000, SID 2000 Digest.
WIPO Publication, WO 99/20081.
WIPO Publication, WO 98/06122.
WIPO Publication, WO 99/39393.

Primary Examiner—Hai Pham

(57) ABSTRACT

A compact light weight printhead capable of direct quasi-contact printing includes an OLED structure deposited onto a substrate. The printhead is designed for contact or quasi-contact printing, without additional optical elements. The printhead design ensures that the desired pixel sharpness and reduced crosstalk is achieved. Two possible different arrangements for the printhead are disclosed. One arrangement includes at least one array of OLED elements. Each OLED array in this arrangement includes at least one triplet of OLED elements, and each element in each the triplet is capable of emitting radiation in a distinct wavelength range different from the distinct wavelength range of the other two color filters in the same triplet. In the second arrangement, the printhead includes at least one triplet of arrays of individually addressable Organic Light Emitting Diode (OLED), elements. In this second arrangement, each OLED array in each triplet has elements that are capable of emitting radiation in a distinct wavelength range different from the distinct wavelength range of the other two arrays in the triplet.

16 Claims, 11 Drawing Sheets

U.S. PATENT DOCUMENTS

| | | | |
|---|---|---|---|
| 5,582,956 A | 12/1996 | Ehret et al. | 430/337 |
| 5,631,118 A | 5/1997 | Gaudiana et al. | 430/270.1 |
| 5,920,080 A | 7/1999 | Jones | 257/40 |
| 5,929,474 A | 7/1999 | Huang et al. | 257/292 |
| 5,952,789 A | 9/1999 | Stewart et al. | 315/169.4 |
| 6,004,719 A | 12/1999 | Gaudiana et al. | 430/270.1 |
| 6,064,418 A | 5/2000 | Shimizu et al. | 347/238 |
| 6,069,443 A | 5/2000 | Jones et al. | 313/504 |
| 6,080,030 A * | 6/2000 | Isaka et al. | 445/24 |
| 6,137,523 A | 10/2000 | Fork | 347/237 |
| 6,195,115 B1 | 2/2001 | Yamaguchi | 347/238 |
| 6,198,494 B1 * | 3/2001 | Haraguchi et al. | 347/232 |
| 6,232,050 B1 * | 5/2001 | Hirai et al. | 430/383 |

* cited by examiner

INTEGRAL ORGANIC LIGHT EMITTING DIODE PRINTHEAD

BACKGROUND OF THE INVENTION

1. Field of the Invention

This invention relates generally to compact, light weight printheads and, more particularly, to integral Organic Light Emitting Diode (OLED) printheads.

2. Background

Light emitting diodes (LED) have been used for exposing photosensitive materials such as photographic film or paper of photocopying receptors. The light emitting diodes are usually arranged in a linear array or a number of linear arrays and means are provided for a relative displacement of the photosensitive materials in relation to the array. In this manner, the material is scanned past the array and an area is exposed thereby creating an image.

The light emitted from LEDs diverges quickly and thus reduces the exposing intensity and increases the exposing area. This can lead to a reduction in sharpness of the exposed image and to the possibility of undesired exposure of adjacent areas. The first of these problems is known as reduced pixel sharpness and the second is known as crosstalk. To avoid these difficulties. optical systems are utilized to transmit the light from the LEDs to the photosensitive material without significant divergence. While this approach results in an acceptable printing system, such systems have their size defined by the optical systems and therefore are not as compact as would be desired for a portable print system.

The light emitting diodes used in existing printers (see for example, Shimizu et al., *LED Arrays, Print Head, and Electrophotographic Printer,* U.S. Pat. No. 6,064,418, May 16, 2000) emit radiation from the surface of a p-n junction (constitute edge emitters) and are typically mounted on a printed circuit board. These characteristics of the LEDs used in previous printers impose constraints on manufacturability and preclude their use in compact contact or quasi-contact printing. Other light source systems (LCDs for example) presently used in printers suffer from similar constraints that preclude their use in compact contact or quasi-contact printing. Innovative designs are needed to satisfy the need for compact printers.

Organic Light Emitting Diodes (OLED), which have been recently developed, (See, for example, the article by S. Forrest, P. Burrows, M. Thompson, *"The Dawn of Organic Electronics"*, IEEE Spectrum, Vol. 37, No, 8, pp. 29–34. August 2000) hold a promise of ease of fabrication and low cost and low power consumption. A recent publication (Y. Tsuruoka et al., *"Application of Organic Electroluminescent Device to Color Print Head"*, SID 2000 Digest, pp. 978–981) describes a print head utilizing OLEDs. The printhead described in this publication comprises discrete OLEDs, color filters and optical elements and therefore is not as compact as desired. Also, the presence of discrete optical elements requires considerations of alignment which have an impact on manufacturability and cost.

It is the primary object of this invention to provide an integral printhead which is compact and light weight and utilizes Organic Light Emitting Diodes (OLED). It is a further object of this invention to provide an integral printhead which avoids crosstalk while providing the necessary pixel sharpness and utilizes Organic Light Emitting Diodes (OLED). Other objects of this invention will become apparent hereinafter.

SUMMARY

The present invention achieves the stated objective by means of a printhead comprising an Organic Light Emitting Diodes (OLED) structure, where the OLEDs emit radiation over at least three separate wavelength ranges, and where the printhead is designed for contact or quasi-contact printing with the desired pixel sharpness and reduced crosstalk. The OLED structure comprises either actively addressable or passively addressable OLED elements.

In one embodiment, the printhead comprises a transparent substrate having a planar light receiving surface opposite to a planar light emitting surface, and an OLED structure comprising at least one array of OLED elements deposited onto the light receiving surface of the substrate. Two possible different arrangements for the printhead are disclosed. In one arrangement. each OLED array in the printhead comprises at least one of a plurality of triplets of OLED elements, and each element in each triplet being capable of emitting radiation in a distinct wavelength range different from the distinct wavelength range of the other OLED elements in the same triplet. In the second arrangement, the printhead comprises at least one of a plurality of triplets of elongated arrays of individually addressable Organic Light Emitting Diode (OLED) elements, each array in the triplet being aligned in substantially parallel relation to any other array in the triplet, each OLED array in each triplet having elements that are capable of emitting radiation in a distinct wavelength range different from the distinct wavelength range of the other two arrays in the triplet.

In another embodiment, the printhead comprises a substrate having a planar first surface opposite to a planar second surface, an individually addressable Organic Light Emitting Diode (OLED) structure, comprising at least one elongated array of individually addressable Organic Light Emitting Diode (OLED) elements and deposited onto the first surface of the substrate, and a substantively transparent layer, deposited onto the OLED structure, having a light receiving surface in effective light transmission relation to the OLED structure, the light receiving surface located opposite to a light emitting surface. Again, the same two alternative printhead arrangements are disclosed for this embodiment.

The parameters including the distance between OLED elements, the characteristic dimensions of the OLED elements, the distance between the OLED elements and the photosensitive material, are selected to optimize the exposure of the photosensitive material at a given pixel area, corresponding to a given OLED element, due to the light intensity from the elements of the array which are adjacent to the given element and from the given OLED element. An exposure is optimized if the Subjective Quality Factor (SQF) of the resulting pixel is as close to 100 as possible and if the intersection of the normalized intensity profile produced by an adjacent OLED element at given pixel locations with the normalized intensity profile produced by the corresponding OLED element is as close to 0.5 as possible.

In order to reduce crosstalk, a border surrounding an unimaged, colorless area equal to the OLED element area and aligned with the OLED element can be created for each of the OLED elements. Such a border would substantially absorb radiation in all three distinct wavelength ranges and could be formed using an imageable material or a material such as an ink or a dye.

The printheads of this invention can be used to expose the entire gamut of photosensitive materials, for example. silver halide film, photosensitive paper, dry silver, photocopyng receptor material, imageable materials comprised of dyes and acid amplifiers and other photosensitive compounds.

These embodiments provide printheads that are light weight and compact, where an OLED structure is deposited onto substrates and, the printheads are designed for direct quasi-contact printing, without additional optical elements, with the desired pixel sharpness and reduced crosstalk. By virtue of their compactness and their light weight, as well as the low power requirements of OLED elements, the printheads of this invention enable the construction of portable printing devices for the mobile data environment.

DESCRIPTION OF THE DRAWINGS

The novel features of this invention are set forth in the appended claims. However, the invention will be best understood from the following detailed description when read in connection with the accompanying drawings wherein:

DETAILED DESCRIPTION

To provide a printhead that is light and compact, which is the primary object of this invention, an OLED structure is deposited onto a substrate and the printhead is designed for contact or quasi contact printing with the desired pixel sharpness and reduced crosstalk. In order to achieve this objective, radiation in at least three separate wavelength ranges must be delivered to the medium. A class of embodiments that achieve this objective are disclosed in this application. A second class of embodiments is disclosed in a related application Ser. No. 09/745,042. In the class of embodiments disclosed in this application, OLEDs emitting at least three separate wavelength ranges are deposited onto the substrate.

All embodiments disclosed below meet the objective of providing a compact light weight printhead capable of direct quasi-contact printing and comprise an OLED structure. The OLED structure includes OLED elements emitting radiation over at least three separate wavelength ranges.

Two classes of embodiments of an OLED structure are presented below. In the first class of embodiments, the OLED structure includes a transparent substrate. In the second class of embodiments, the OLED structure is deposited onto a separate substrate and includes a transparent layer.

OLED Structures Including a Transparent Substrate

Figure 1:
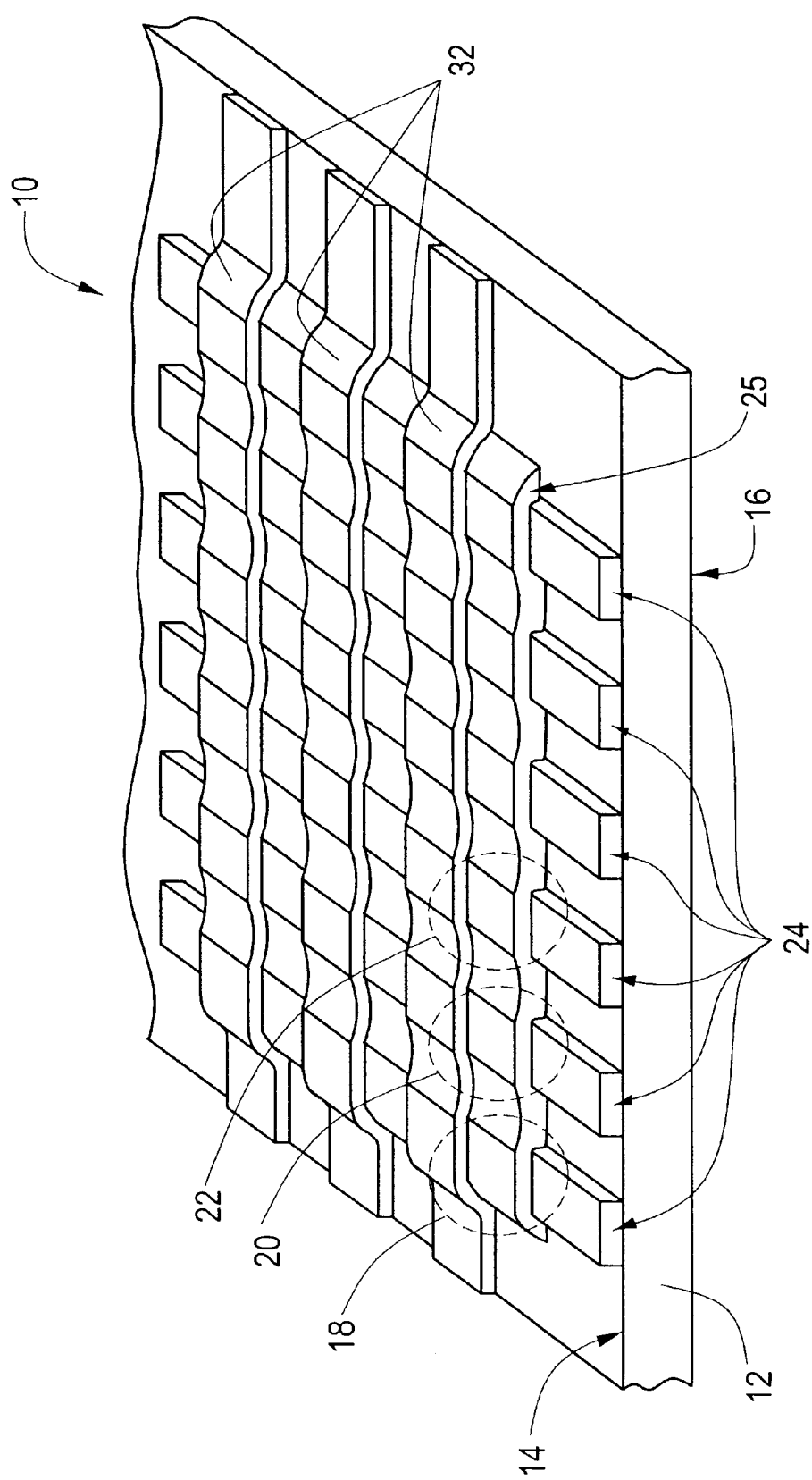
FIG. 1 depicts a graphical representation of the first embodiment of an OLED printhead and illustrates the components of a passively addressable OLED structure.

Referring to FIGS. 1–3, a printhead assembly of one embodiment of this invention is shown at 10. As shown in FIG. 1, a substantively transparent substrate 12, having a substantially planar light receiving surface 14 oppositely spaced apart from and substantively parallel to a substantially planar light emitting surface 16, serves as a base on which to deposit the Organic Light Emitting Diode (OLED) structure 50, comprising OLED arrays 18, 20 and 22. The OLED structure 50, comprising arrays 18, 20 and 22 of individually addressable Organic Light Emitting Diode (OLED) elements is deposited onto and in effective light transmission relation to the light receiving surface 14 of the substrate 12. In one embodiment, the OLED structure consists of transparent anode columns 24, organic layers 25 and cathode rows 32. (The term substantively or substantially transparent describes a material that has high transmittance over the broad range of wavelengths of interest that is, the range of wavelength of OLED emission. For comparison, the typical commercial specification for transparent electrodes requires that two superposed electrodes will have a transmittance of at least 80% at 550 nm.) The anode rows and cathode columns can, in one embodiment, be extended beyond the OLED structure in order to constitute conductive lines or electrical contacts. In that embodiment, the driver control circuits 46, 48 for selectively controlling the energizing of said Organic Light Emitting Diode (OLED) elements are connected to the row and column electrodes by electrical connection means such as elastomer connectors (sometimes called "zebra links"; commercial examples are L type connectors from Potent Technology Inc., and "G" type connectors from ARC USA/GoodTronic Corporation). Other electrical connection means for selective connection of the individually addressable light emitting elements to the driver circuits are conductive interconnecting lines. The conductive interconnecting lines can be selectively deposited on the light receiving surface of the substrate in a manner whereby they provide connecting means. If conductive interconnecting lines are used, the driver control circuits 46 and 48 are connected by means, such as wire bonding or solder bumping, to selected ones of the conductive interconnecting lines. (The driver control circuits could be mounted on the light receiving surface of the substrate 14, or could be located elsewhere. If the driver control circuits are mounted elsewhere, the connection means will also include electrical leads and connectors as is well known to those schooled in the art.) When conductive interconnecting lines are used, they are connected to the individually addressable OLED elements either by means of the deposition process or by wire bonding or solder bumping. It should also be apparent to those skilled in the art that it is possible to extend and position the electrodes from the rows and columns to constitute the conductive interconnecting lines.

Figure 2A:
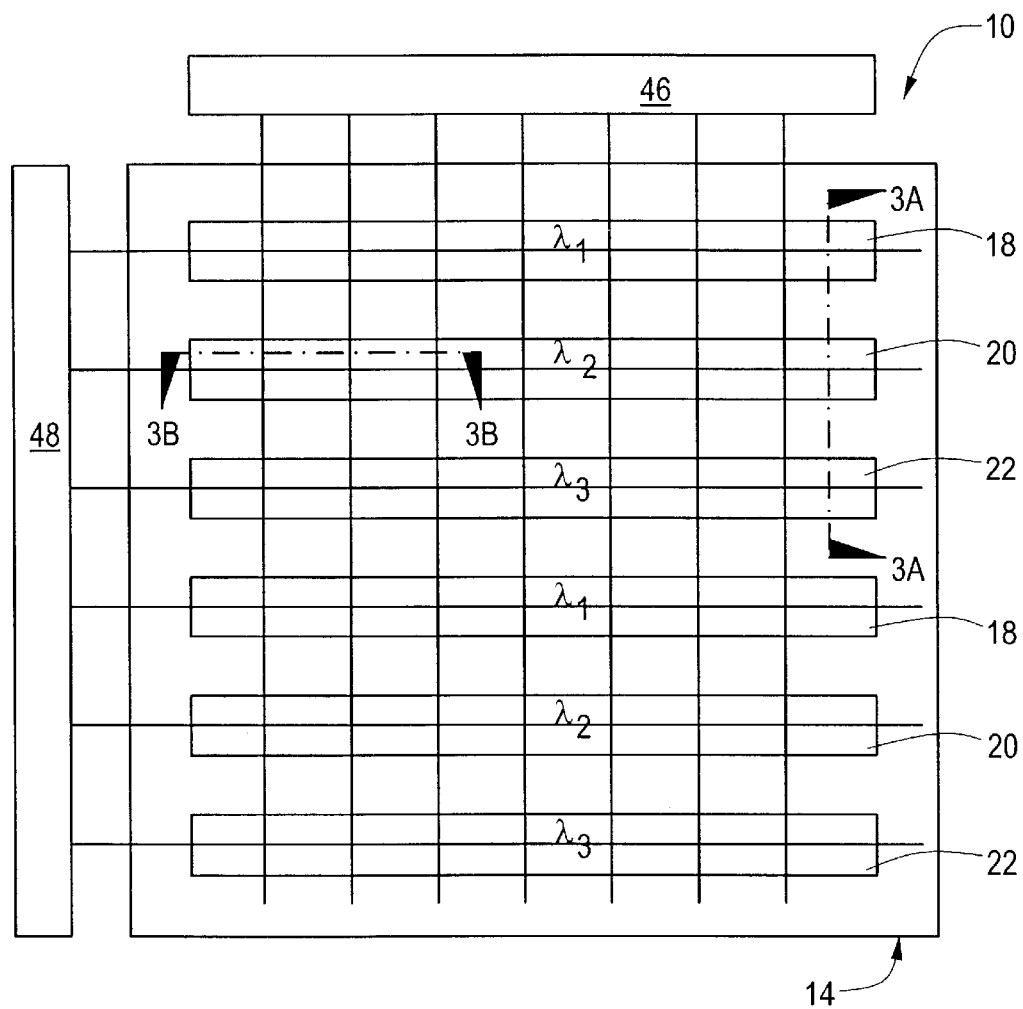
FIG. 2A is a plan view of the first embodiment of an OLED printhead where the printhead comprises a plurality of triplets of arrays where each array in the triplet emits radiation in a distinct range of wavelengths.

Referring to FIG. 2A, at least one triplet (three) of the elongated arrays of individually addressable Organic Light Emitting Diode (OLED) elements 18, 20 and 22 is deposited on the substantively transparent substrate 12, the arrays in the triplet being aligned in substantially parallel spaced relation with respect to each other, each array in the triplet being capable of emitting radiation in a distinct wavelength range different from the other two arrays, such as, for example, red, green, and blue, and each triplet is aligned in substantially parallel spaced relation with respect to every other array triplet. This printhead configuration of FIG. 2A, when it comprises only one triplet of arrays, would enable the exposing of a photosensitive material one line at a time. When the configuration shown in FIG. 2A comprises many triplets of arrays, it would enable exposing an area.

The OLED is energized when a voltage is placed across the anode and cathode terminals. In analogy to liquid crystal displays, it is possible to construct both actively addressable and passively addressable OLEDs. In an actively addressable OLED structure, there is additional circuitry that allows selecting an element in the structure. The driver control circuits 46 and 48 for selectively controlling the energizing of said Organic Light Emitting Diode (OLED) elements are connected to the row and column electrodes. The driver control circuits 46 connected to the column electrodes of OLED arrays are located in the direction parallel to the arrays. The driver control circuits 48 connected to the row electrodes of OLED arrays are located in the direction perpendicular to the arrays.

Figure 3A:
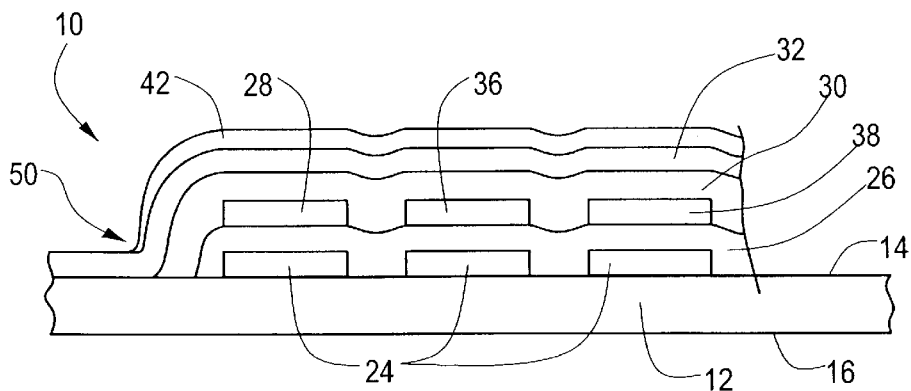
FIG. 3A is a cross-sectional view, for a passively addressable OLED structure, across three arrays in the triplet of FIG. 2A and illustrates the components of a passively addressable OLED structure.
Figure 3B:
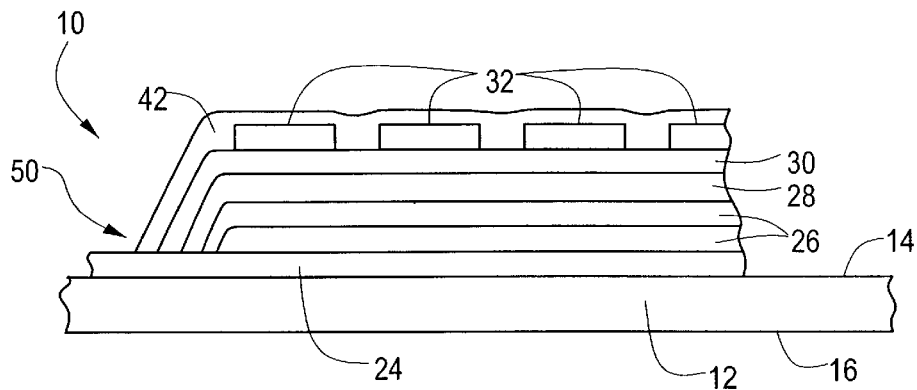
FIG. 3B is a cross-sectional view, for a passively addressable OLED structure, along the array of FIG. 2A and further illustrates the components of a passively addressable OLED structure.

A cross sectional view across the three OLED arrays, the structure of FIG. 2A, depicting one element in each array, is shown in FIGS. 3A and 3B, illustrating the case of passively addressable OLEDs. Each OLED element starts with a patterned transparent conducting layer 24 which serves as an anode. Such layer consists of a material such as indium tin oxide (ITO) which is a transparent conductor, or a combination of a layer of high refractive index material, a conductive layer, and another high index layer (for example, ITO, silver or silver/gold, and ITO as described in WTO publication WO 99/36261), and is deposited by vacuum deposition techniques such as sputtering or evaporation. In order to create the row pattern, techniques well known to those skilled in the art, such as photoresist and etching techniques or laser ablation, are used to remove the excess material. The organic layers are deposited next.

Deposition techniques for the organic layer range from those used organic polymer or dyes, such as coating, spin coating and innovative mass transfer techniques to the standard vacuum deposition techniques, such as sputtering or evaporation and also including ink jet printing and thermal transfer. At least two organic layers are used in each array although three layer structures are most common. First, a hole transport layer 26 is deposited (the hole transport layer is common to the arrays emitting in all three wavelength ranges). Then, an electroluminescent layer is deposited for each array (one layer 28 for the array emitting at the first wavelength range, another 36 for the array emitting at the second wavelength range, and another 38 for the array emitting at the third wavelength range). An electron transport layer 30, which is common to the arrays emitting at all three wavelengths, is then deposited. (It is possible to combine the electroluminescent layer and the electron transport layer into one layer. In this case, that layer is different for every wavelength and layer 30 is absent.) A cathode structure 32 is deposited next using vacuum deposition techniques. For a passive addressing OLED printhead the cathode structure is a conductive material structure such a, a magnesium silver alloy layer and silver layer or metals such as silver, gold, aluminum, copper, magnesium or a combination thereof. The conductive material 32 in FIG. 3A forms a column electrode. For an active addressing OLED printhead a structure consisting of a conductive material and a transistor switch (or two transistors and a capacitor) at each element is required. Finally, a protective coating 42 is deposited by any of a variety of means (similar to the organic layers).

A cross-sectional view along the array, for the case of passively addressable OLEDs and the structure of FIG. 2A, is shown in FIG. 3B. The organic layers 26, 28 and 30 and the anode now extend along the array and the anode 24 constitutes a row electrode.

Exposing a photosensitive material with the printhead of FIG. 2A occurs in the following manner. The printhead is placed over the photosensitive material such that the planar light emitting surface of the substrate is oppositely spaced apart at a given distance from and substantively parallel to the light receiving surface of the photosensitive material. In the passive addressing mode as would be the case for printing on highly sensitive instant silver halide film, one row at a time is addressed and printed before multiplexing to the next row. At the completion of addressing and printing all the rows that emit in one wavelength range (red, for example), the OLED print engine is moved one row relative to the film plane and the addressing and printing process repeated with next wavelength range (for example, green). This movement occurs in the direction perpendicular to both the distance between the printhead and the light receiving surface of the photosensitive material. This shifting and printing operation is repeated one more time such that every image pixel in the frame can be exposed to, for example, red, green and blue light (FIG. 2A). For a line exposure, the method is the same as in the preceding discussion but the printhead has to be returned to the starting location or the process must be carried in reverse order while printing the next line. The total print time, for an area exposure, is dependent on print size and is equal to the number of rows times the sum of the exposure time for each color plus twice the short time to move the print engine one row. In the active addressing mode, where each element has a transistor switch (two transistors and a capacitor), it is possible to energize all the OLEDs at the same time. In this case the total print time is independent of print size and, for an area exposure, is equal to three times the longest exposure time plus, again, the time to move the print engine (or the film) one row, twice.

Figure 2B:
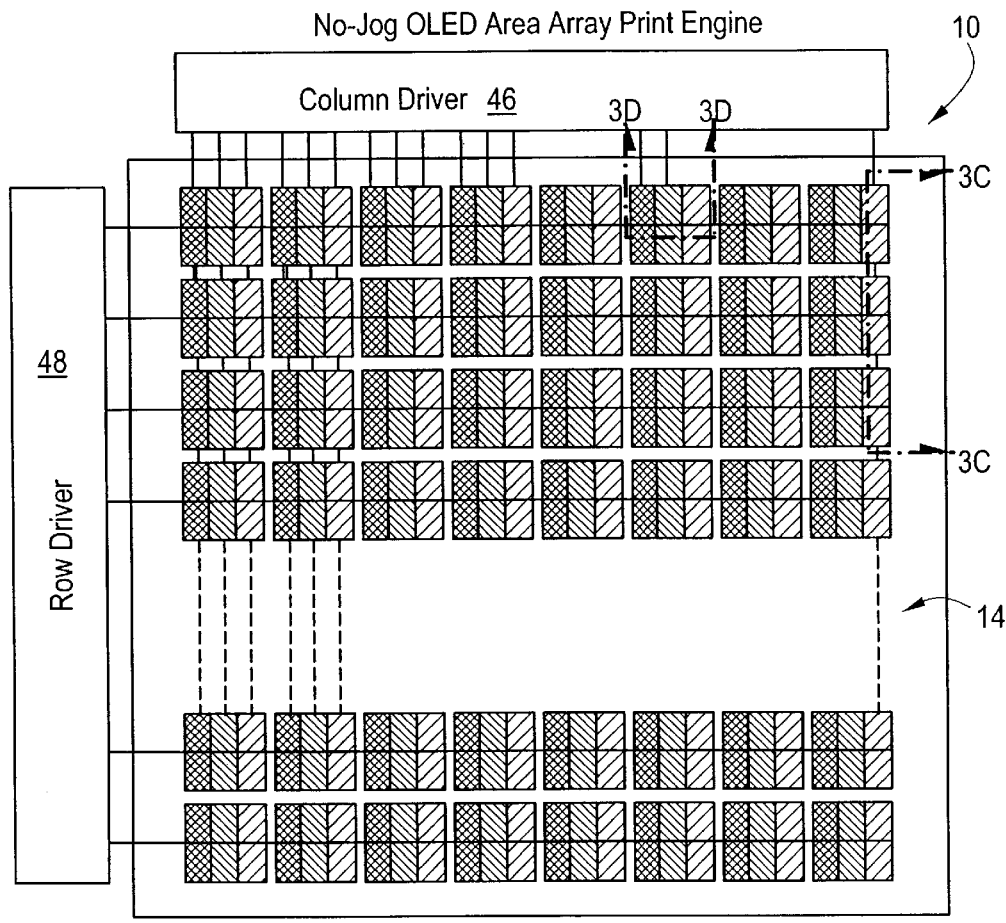
FIG. 2B is a plan view of the first embodiment of an OLED printhead where each array is comprised of a plurality of triplets of OLED elements and each element in each of the triplets emits radiation in a distinct wavelength range.
Figure 3C:
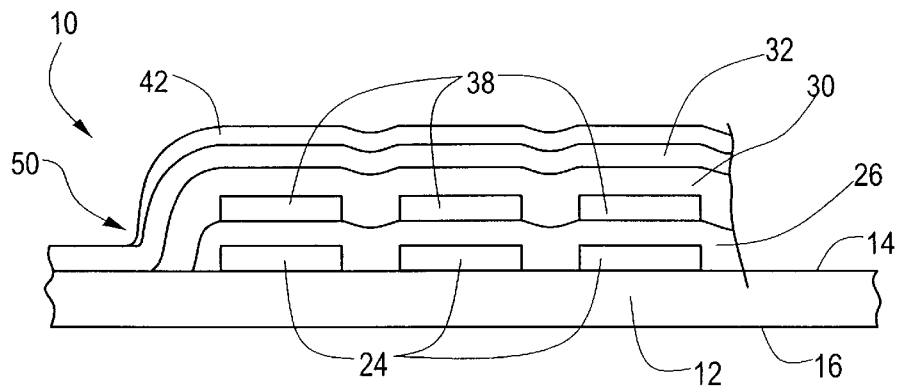
FIG. 3C is a cross-sectional view, for a passively addressable OLED structure, across three arrays are FIG. 2B and illustrates the components of a passively addressable OLED structure in FIG. 2B.
Figure 3D:
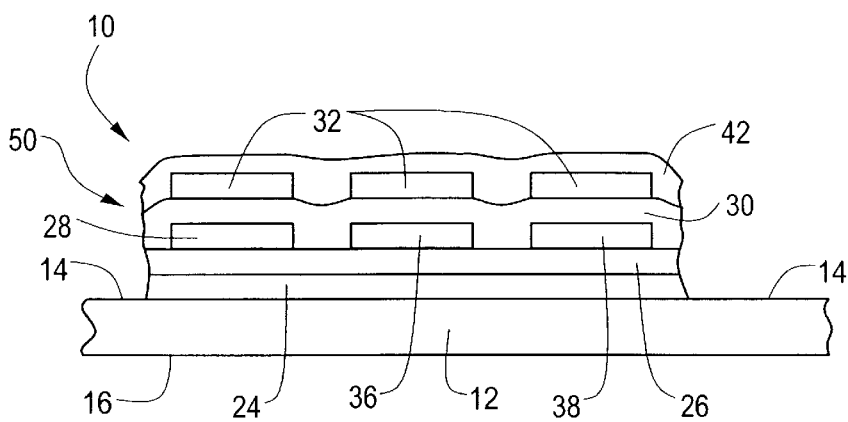
FIG. 3D is a cross-sectional view, for a passively addressable OLED structures, along the array of FIG. 2B and across one triplet of OLED elements in that array.

In an alternative arrangement of the embodiment of FIG. 1, shown in FIG. 2B, each OLED array is comprised of a plurality of triplets of OLED elements, and each element in each of the triplets is capable of emitting radiation in a distinct wavelength range different from the other two elements in the same triplet, (red, green, and blue for example). The differences between this arrangement and the arrangement shown in FIG. 2A can also be seen from the cross sectional views shown in FIGS. 3C and 3D. Referring to FIG. 3C, it is similar to FIG. 3A except that all three electroluminescent layers 38 emit in the same wavelength range. Referring now to FIG. 3D, while in FIG. 3B (which is the corresponding cross section for FIG. 2A) the electroluminescent layer is continues and emits in one wavelength range, in FIG. 3D there are three electroluminescent layers each emitting radiation in a distinct wavelength range (one layer 28 for the array emitting at the first wavelength range, another 36 for the array emitting at the second wavelength range, and another 38 for the array emitting at the third wavelength range). That is, in the embodiment of FIG. 2A, along the array all OLEDs emit in the same wavelength range while, in the embodiment of FIG. 2B, along the array there are consecutive groups of three elements where each element emits in a different wavelength range. The printhead of FIG. 2B would not require moving one row relative to the film plane and repeating the addressing and printing process with new data. In the passive addressing mode, the total print time, for an area exposure, is dependent on print size and is equal to the number of rows times the longest exposure time for any wavelength range. In the active addressing mode, the total print time is independent of print size and, for an area exposure, is equal to the longest exposure time.

In a modification of both of the embodiments of FIGS. 2A and 2B a single continuous layer of a photosensitive imaging system, such as those materials described in U.S. Pat. Nos. 4,602,263; 4,720,449; 4,720,450; 4,745,046; 4,818,742; 4,826,976; 4,839,335; 4,894,358; 4,960,901; 5,582,956; 5,621,118 and 6,004,719, is coated onto the light emitting surface of the transparent substrate or, a material, such as a black dye or ink, is coated onto the light emitting surface of the transparent substrate by means of inkjet or thermal transfer printing. For each of the OLED elements, a border surrounding an unimaged, colorless area equal to the OLED element area and aligned with the OLED element can be created. Such a border would substantively absorb radiation in all three distinct wavelength ranges (for example, a black border). The border will help to reduce crosstalk. One procedure for defining an area equal to the area of the OLED element and aligned with the OLED element starts from the characteristic surface dimension which is substantially the same for all OLED elements and from which a center point can be defined for each OLED elements. From the center of each OLED element, a corresponding image point can be defined. Such an image point would be located on the light emitting surface of said imageable layer, in the embodiment utilizing an imageable layer; or, it would located on at the light emitting surface of the substrate for the embodiment utilizing a material such as an ink or dye. By locating the corresponding image point along the line perpendicular to the surface on which the OLED structure is deposited, where this line also passes through the center point of the OLED element, the center point and the corresponding image point are aligned. Then an area having the corresponding image point as its center point and having the same characteristic dimensions as the OLED elements will be congruent with the OLED area.

OLED Structure on a Separate Substrate

Figure 4A:
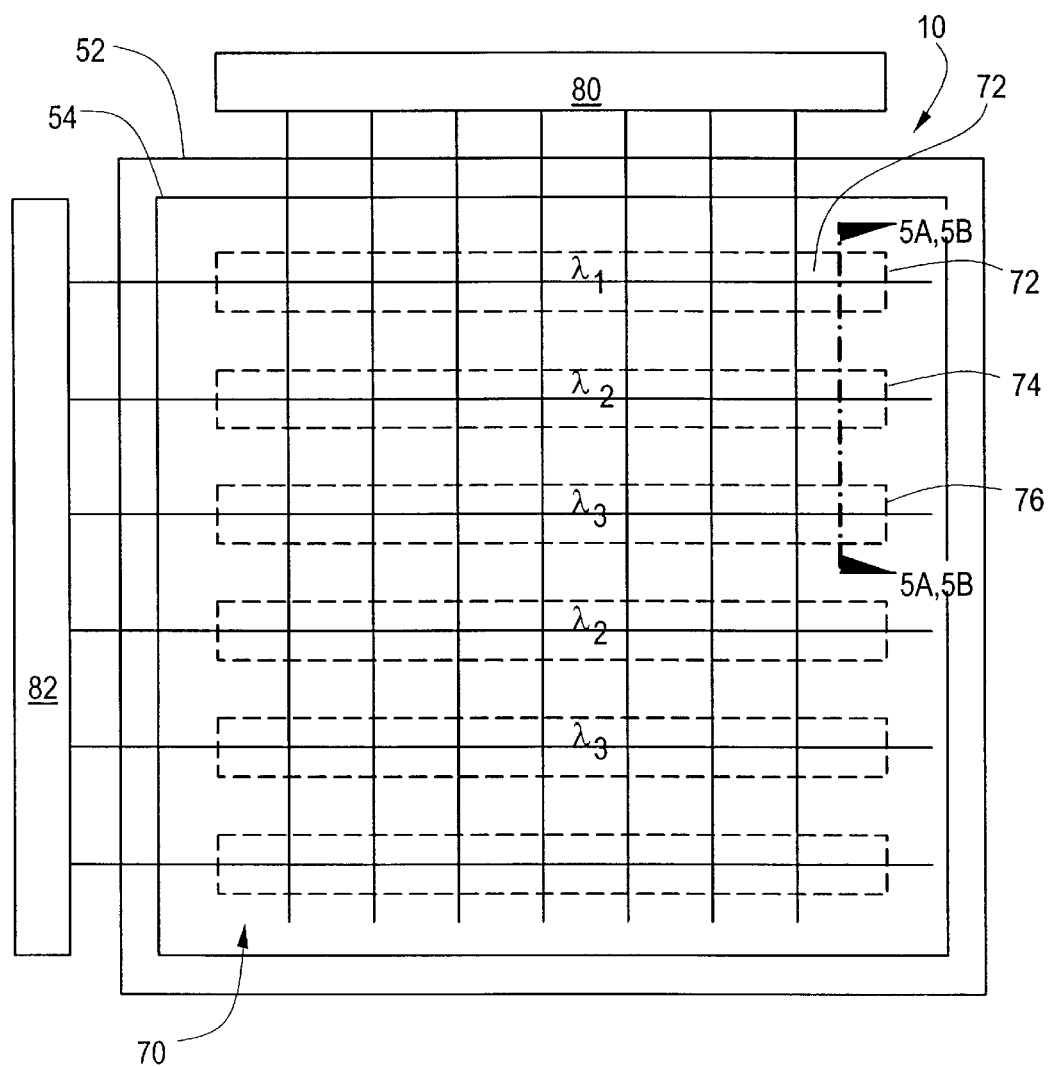
FIG. 4A is a plan view of the another embodiment of an OLED printhead where the printhead comprises a plurality of triplets of arrays of OLED elements, where the elements in each array in the triplet emit radiation in one distinct range of wavelengths different from the distinct wavelength range of the other OLED arrays in the triplet, and the printhead includes a substrate and a transparent layer.
Figure 4B:
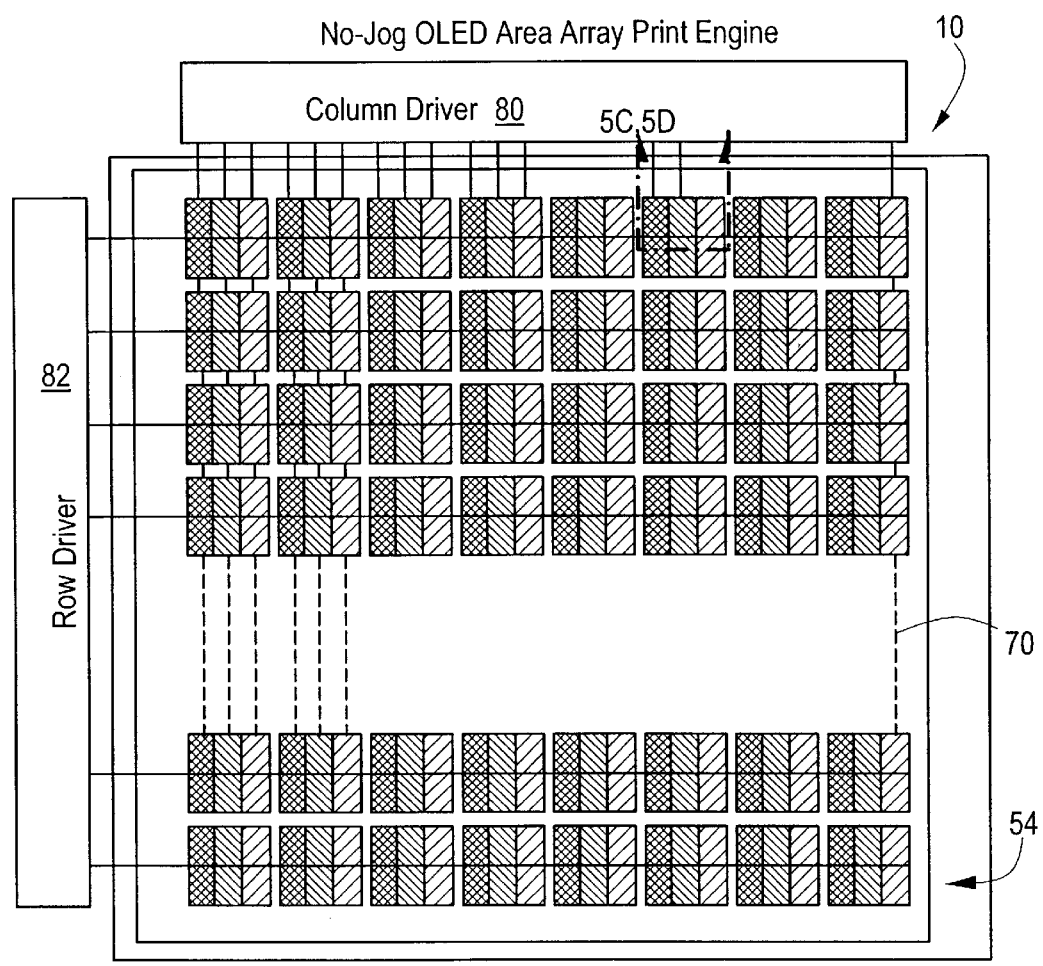
FIG. 4B is a plan view of the second embodiment of an OLED printhead, where the printhead comprises at least one array OLED elements, and where each OLED array is comprised of a plurality of triplets of OLED elements and each element in each of the triplets emits radiation in a distinct wavelength range, and the printhead includes a substrate and a transparent layer.
Figure 5A:
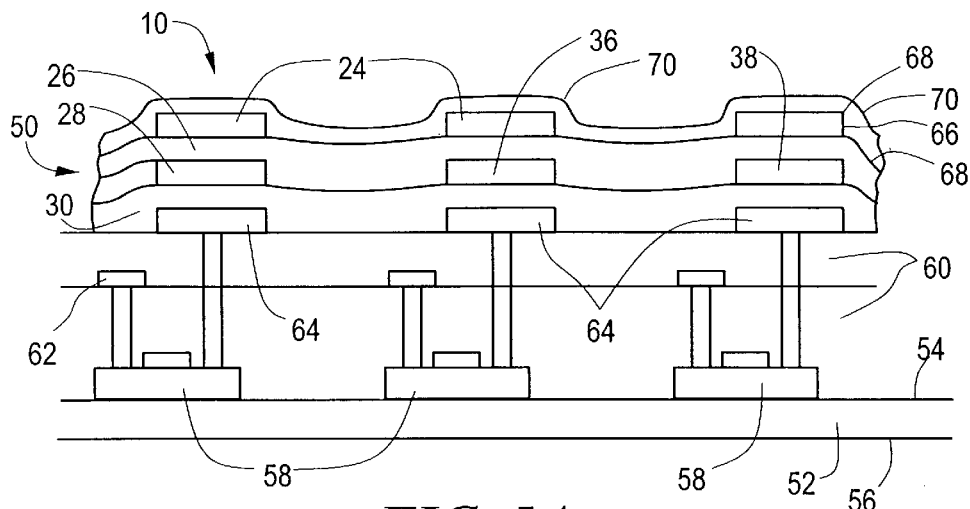
FIG. 5A is a cross-sectional view, for an actively addressable OLED structure, across three arrays of the underlying OLED structure in the triplet of FIG. 4A and illustrates the components of an actively addressable OLED structure.
Figure 5B:
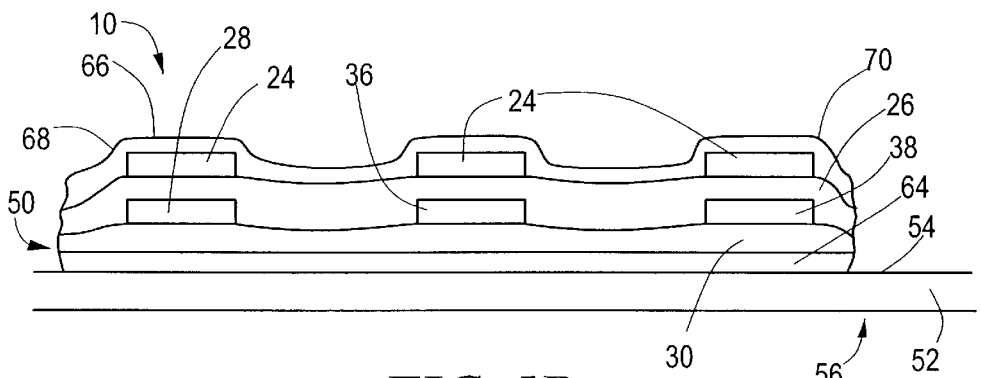
FIG. 5B is a cross-sectional view, for passively addressable OLED structure, across three arrays of the underlying OLED structure in the triplet of FIG. 4A and illustrates the components of a passively addressable OLED structure.

A second embodiment, is shown in FIGS. 4A, 4B, 5A, 5B, 5C and 5D. Referring to FIG. 4A, a substrate 52 having a substantially planar first surface 54 oppositely spaced apart from a substantially planar second surface 56 serves a base on which to deposit an individually addressable Organic Light Emitting Diode (OLED) structure, the OLED structure comprising at least one elongated array of individually addressable Organic Light Emitting Diode (OLED) elements 72. For the actively addressable OLED structure shown in FIGS. 5A and 5C, the OLED elements comprise a transistor switch (the transistor switch comprising a plurality of transistors and a capacitor) 58, at least one planarizing layer 60, a plurality of contact pads and electrical busses 62. Both actively addressable and passively addressable OLED structures (refer to FIGS. 5B and 5D for passively addressable structures) contain a cathode 64, a plurality of layers of organic materials, and a transparent anode 24. For actively addressable OLED structures, the transistor switch 58 is deposited in the closest proximity to the first surface 54. For passively addressable OLED structures, referring to FIGS. 5B and 5D, the cathode 64 is deposited in the closest proximity to the first surface 54. For both the actively addressable structures shown in FIGS. 5A and 5C and the passively addressable structures of FIGS. 5B and 5D, the transparent anode is deposited in the farthest separation from the first surface, and, a substantively transparent layer 66 is deposited onto the OLED structure. The transparent layer 66 has a light receiving surface 68 in effective light transmission relation to the transparent anode 24, the light receiving surface 68 is oppositely spaced apart from a light emitting surface 70. This structure is further defined in FIG. 5A, and FIG. 5B. Referring to FIG. 5A and FIG. 5B, specific to actively addressable OLED structures, a substrate 52 serves as a base on which to deposit an actively addressable Organic Light Emitting Diode (OLED) structure. The substrate material could be glass, a plastic substrate suitable for deposition, or a semiconductor wafer. The transistor switch 58 is deposited on the first surface 54 of the substrate 52. (FET transistor switches are well-known to those skilled in the art. Inuka and co-workers have shown a transistor switch configuration in the Sid 00 Digest, p. 924. It should be apparent to those skilled in the art how to modify that switch in order to connect the cathode to the transistor.) A planarizing layer 60 separates the transistor switch from the busses and contact pads 62 and the busses and contact pads 62 from the cathode structure 64. The planarizing layer could be constructed out of a material like silicon oxide ($SiO_2$) and the cathode structure is a conductive material structure such as a magnesium silver alloy layer and silver layer or metals such as silver, gold, aluminum, copper, calcium, magnesium or a combination thereof deposited using vacuum deposition techniques.

Figure 5C:
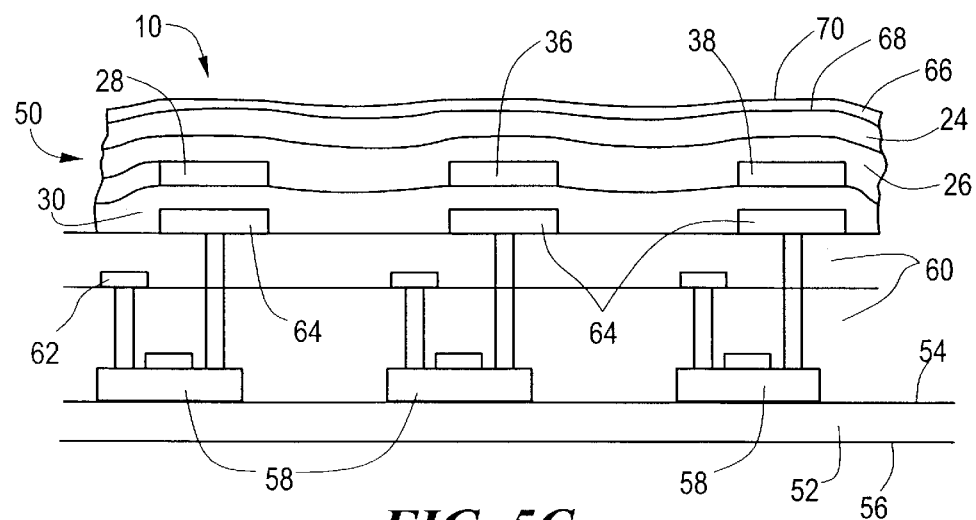
FIG. 5C is a cross-sectional view, for actively addressable OLED structure, along one array in FIG. 4B and further illustrates the components of an actively addressable OLED structure.
Figure 5D:
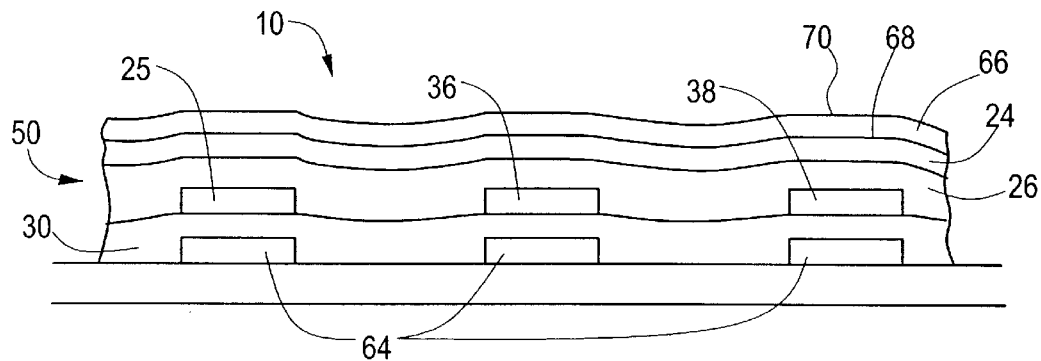
FIG. 5D is a cross-sectional view, for passively addressable OLED structure, along one array in FIG. 4B and further illustrates the components of a passively addressable OLED structure.

For passively addressable OLED structures, shown in FIGS. 5B and 5D, a cathode structure 64 is deposited on the first surface 54 of the substrate. (Deposition on a substrate also includes preparing the surface, by planarizing it or passivating it, if any preparation is needed.)

Referring again to FIGS. 5A, 5B, 5C and 5D, the organic layers 26, 28 and 30 are deposited next. An electron transport layer 30, which is common to the arrays emitting at all three wavelengths is deposited first. Then, an electroluminescent layer is deposited for each array (one layer 28 for the array emitting at the first wavelength range, another 36 for the array emitting at the second wavelength range, and another 38 for the array emitting at the third wavelength range). It is possible to combine the electroluminescent layer and the electron transport layer into one layer. In this case, that layer is different for every wavelength and layer 30 is absent. Next, a hole transport layer 26 is deposited (the hole transport layer is common to the arrays emitting in all three wavelength ranges). Next, a transparent conducting layer 24 which serves as an anode is deposited. The anode layer consists of a material such as indium tin oxide (ITO) which is a transparent conductor, or a combination of a layer of high refractive index material, a conductive layer, and another high index layer (for example, ITO, silver or silver/gold, and ITO as described in WTO publication WO 99/36261), and is deposited by vacuum deposition techniques such as sputtering or evaporation. In order to create the row pattern, techniques well known to those skilled in the art, such as photoresist and etching techniques or laser ablation, are used to remove the excess material. Finally, a substantially transparent layer is deposited. This transparent layer could acrylic or polycarbonate or a transparent polymer and can be deposited by techniques such as coating or spin coating.

FIG. 5C shows a different view of the structure for the case of actively addressable OLED structures. In that view, the busses and contact pads are explicitly shown.

It is possible to construct an actively addressable structure with a transparent cathode. In that case (not shown), the transistor switch is deposited in the closest proximity to the first surface, the anode is deposited next, the organic layers are then deposited in reverse order from those of FIGS. 5A and 5C. That is, the hole transport layer is deposited onto the anode, followed by the electroluminescent layer, and, finally an electron transport layer. A transparent cathode is then deposited. A transparent cathode consists, for example, of a thin layer of a conductive material structure of appropriate work function such as a magnesium silver alloy or magnesium layer followed by a layer of a transparent conductive material such as indium tin oxide (ITO) (see WTO publication WO 99/20081 A2 and WTO publication WO 98/061122 A1 and references theirein).

The anode rows and the busses, in the case of actively addressable OLED structures, or the cathode columns, in the case of passively addressable OLED structures, can, in one embodiment, be extended beyond the OLED structure in order to constitute conductive lines or metallic contacts. In that embodiment, the driver control circuits 80 and 82 for selectively controlling the energizing of said Organic Light Emitting Diode (OLED) elements are connected to the row and column electrodes by electrical connection means such as elastomer connectors (sometimes called "zebra links".) Additional electrical connection means for selective connection of the individually addressable light emitting elements to the driver circuits are conductive interconnecting lines. If external conductive interconnecting lines are used, the conductive interconnecting lines are selectively deposited on the first surface of the substrate in a manner whereby the conductive interconnecting lines provide for selective connection to the individually addressable light emitting elements. If conductive interconnecting lines are used, the driver control circuits 80 and 82 are connected by electrical connection means, such as wire bonding or solder bumping, to selected ones of the conductive interconnecting lines. The driver control circuits could be mounted on the first surface of the substrate 54, or could be located elsewhere. If mounted elsewhere the connection means will also include electrical leads and connectors as is well known to those schooled in the art.

The conductive interconnecting lines are connected to the individually addressable OLED elements either by means of the deposition process or by wire bonding or solder bumping. It should also be apparent to those skilled in the art that it is possible to extend and position the electrodes from the rows and busses to constitute the conductive interconnecting lines. FIG. 4A depicts the case where the OLED structure comprises at least one of plurality of triplets 72, 74 and 76 of elongated arrays of individually addressable Organic Light Emitting Diode (OLED) elements, each array in the triplet being aligned in substantially parallel spaced relation with respect to each other array in the triplet, each array in each triplet being capable of emitting radiation in a distinct wavelength range different from the distinct wavelength range of the other two arrays in the triplet, each triplet being aligned in substantially parallel spaced relation with respect to any other array triplet. FIG. 4B depicts the case where the at least one array of OLED elements is comprised of a plurality of triplets of OLED elements, and each element in each triplet being capable of emitting radiation in a distinct wavelength range different from the other two elements in the same triplet (red, green, and blue for example). Exposure methods for the printheads of FIGS. 4A and 4B are identical to those of the printheads of FIGS. 2A and 2B. For the printhead of FIG. 4A, the total print time, for an area exposure performed with passively addressable OLED elements, is dependent on print size and is equal to the number of rows times the sum of the exposure time for each color plus twice the short time to move the print engine one row. In the active addressing mode, where each element has a transistor switch (two transistors and a capacitor), it is possible to energize all the OLEDs at the same time. In this case the total print time is independent of print size and, for an area exposure, is equal to three times the longest exposure time plus, again, twice the time to move the print engine (or the film) one row.

For the printhead of FIG. 4B, for the passive addressing mode, the total print time is dependent on print size and is equal to the number of rows times the longest exposure time for any wavelength range. In the active addressing mode, the total print time is independent of print size and, for an area exposure, is equal to the longest exposure time.

In a modification of both of the embodiments of FIGS. 4A and 4B a single continuous layer of a photosensitive imaging system, such as those materials described in U.S. Pat. Nos. 4,602,263; 4,720,449; 4,720,450; 4,745,046; 4,818,742; 4,826,976; 4,839,335; 4,894,358; 4,960,901; 5,582,956; 5,621,118; and 6,004,719, is coated onto the light emitting surface of the transparent layer or, a material, such as a black dye or ink, is coated onto the light emitting surface of the transparent layer by means of inkjet or thermal transfer printing. For each of the OLED elements, a border surrounding an unimaged, colorless area equal to the OLED element area and aligned with the OLED element can be created. Such a border would substantively absorb radiation in all three distinct wavelength ranges (for example, a black border). The border will help to reduce crosstalk. One procedure for defining an area equal to the area of the OLED element and aligned with the OLED element starts from the characteristic surface dimensions which are substantially the same for all OLED elements and from which a center point can be defined for each OLED elements. From the center of each OLED element, a corresponding image point can be defined. Such an image point would be located on the light emitting surface of the imageable layer, in the embodiment utilizing an imageable layer, or, it would located on the light emitting surface of the transparent layer for the embodiment utilizing a material such as an ink or dye. By locating the corresponding image point along the line perpendicular to the surface on which the OLED structure is deposited, where this line also passes through the center point of the OLED element, the center point and the corresponding image point are aligned. Then an area having the corresponding image point as its center point and having the same characteristic dimensions as the OLED elements will be congruent with the OLED area.

Optimizing the Printhead Dimensions

In the group of embodiments of the printhead, the radiation originating from any OLED element in any array and impinging on the light receiving surface of the photosensitive material defines a pixel area, with a characteristic pixel dimension, on the light receiving surface of the photosensitive material. For a given distance between the planar light emitting surface of the substrate and the light receiving surface of photosensitive material,. the spacing between centers of the OLED elements. the characteristic surface dimensions of the OLED elements, and the distance between the light emitting surface and the light receiving surface of the substrate in one class of embodiments (or the distance between the light emitting surface and the light receiving surface of the transparent layer, in the other class of embodiments) are jointly selected so that, at a given pixel area, the pixel area corresponding to a given OLED element, the exposure of the photosensitive material due to the light intensity from the elements of the given array which are adjacent to the given element, is optimized and adequate pixel sharpness is obtained. Details of an optimization procedure and an example for a film type are given below.

Optimization Procedure

Calculating the Intensity at the Pixel Area

Figure 6:
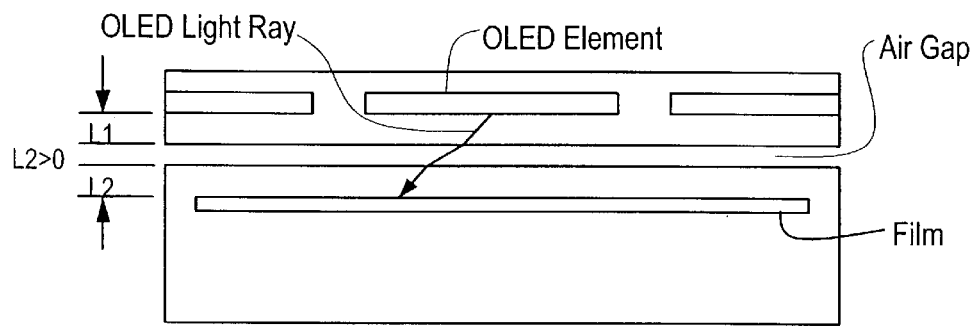
FIG. 6 is a graphical illustration of the geometry for the optimization calculations.
Figure 7:
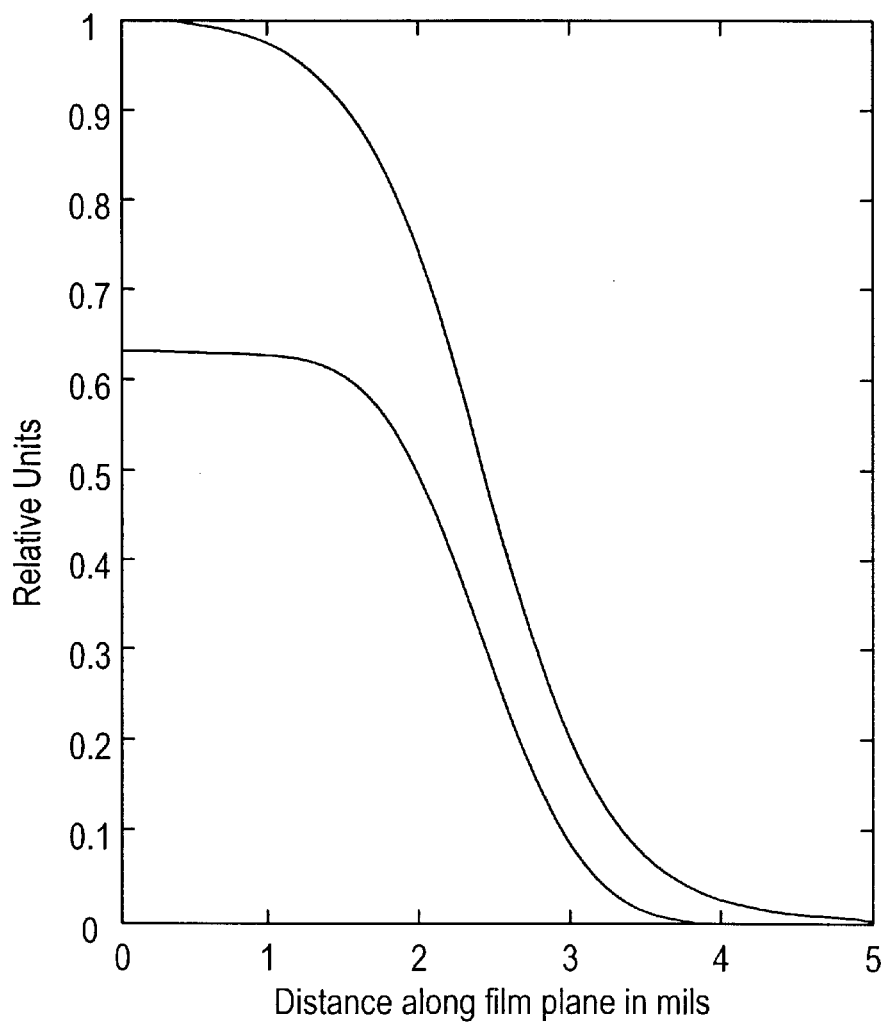
FIG. 7 depicts the calculated intensity profiles at a given pixel from one OLED element element and for two given separations between the printhead and the photosensitive medium.

In order to calculate the intensity at the pixel area, the spread of the emission from each of the OLED elements is considered to be Lambertian. That is, the radiation intensity from each area of the source small enough to be considered a point source falls of as the cosine of the angle of between the observation point and the normal to the surface. (The intensity is defined as the power emitted per unit solid angle.) Thus, it is possible to calculate the intensity at the pixel area due to a source area taking into account the propagation of the light through the substrate material which has a different index of refraction, as shown in FIG. 6. (A complete and general discussion of how to calculate the propagation of the radiation from the source to the pixel can be found in Jackson, *Classical Electrodynamics, 2$^{nd}$ edition,* pp. 427–432, ISBN 0-471-43132-X) calculated intensity profiles at a given pixel, from one OLED element and for two given separations between the printhead and the photosensitive medium, are shown in FIG. 7. Calculating the pixel area requires taking into account the MTF and sensitivity of the film and the radiation intensity at the pixel location. The method and techniques for calculating the pixel area are well known to those skilled in the art.

Optimization of the Pixel Sharpness

Once the intensity profile at a given pixel from one OLED element and for a given separation between the printhead and the photosensitive medium is known, it is possible to calculate a measure of the pixel sharpness. The most commonly used measure of pixel sharpness is the SQF (subjective quality factor). The SQF is defined from the intensity profile produced by one OLED element or color filter array element at a given pixel location at the photosensitive medium. The intensity profile produced by one OLED element or color filter array at a given pixel location at the photosensitive medium is the point spread function. To compute the SQF, the point spread function is represented in the spatial frequency domain (for a review of transforms from the space domain to the spatial frequency domain, see Dainty and Shaw, Image Science, Chapter 6, ISBN 0-12-200850-2). The magnitude of the transform of the point spread function is the modulation transfer function, MTF(t). The SQF is defined as $$\frac{\int_{u\min}^{u\max} MTF(u)\, d(\log u)}{\int_{u\min}^{u\max} d(\log u)}$$

where u max and u min are the spatial frequency limits of the of the visual bandpass response.

This is the SQF as defined by Granger and Cupery (Granger, Cupery, *Phot. Sci. Eng.,* Vol. 15, pp. 221–230, 1972), who correlated the calculated SQF with acceptance ranking by observers. They found that an SQF close to 100% obtains the highest quality ranking for sharpness. Thus, the SQF is a good measure of pixel sharpness.

Crosstalk

Figure 8:
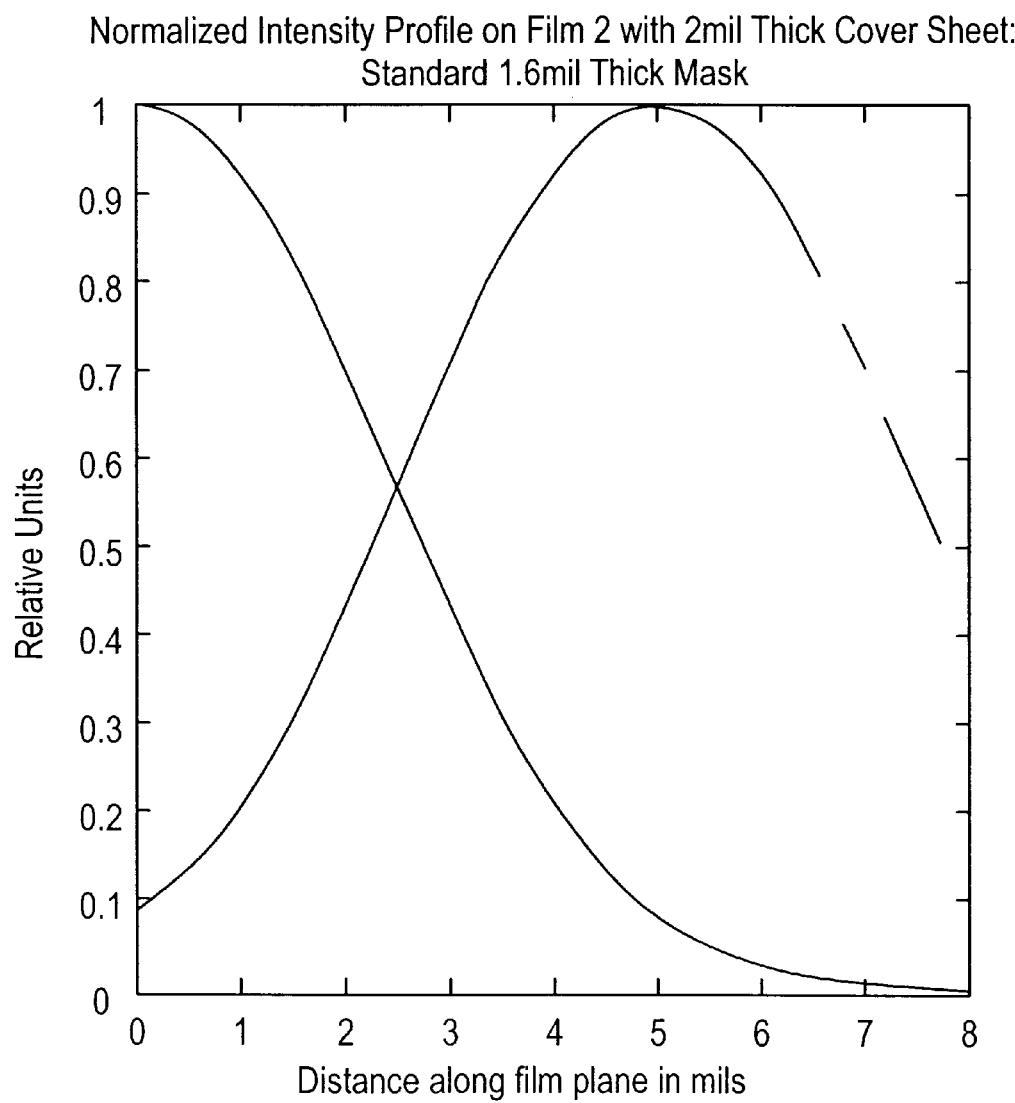
FIG. 8 depicts the calculated intensity profile produced by adjacent OLED elements at given pixel locations at the photosensitive medium.

Crosstalk arises from the fact that emission from light emitting diodes is Lambertian, which means that some of the light emitted from any diode or filter will expose the medium in an adjacent area. In other words, the output from any given diode will expose nearest neighbor image pixels to some extent. Some overlap is acceptable since it leads to a uniform intensity profile. The calculation of crosstalk is similar to that of pixel sharpness. That is, the intensity profile produced by adjacent OLED elements or color filter array elements at given pixel locations at the photosensitive medium is calculated. An example is shown in FIG. 8. The intersection of the two normalized intensity lines has an absolute optimum value of 0.5. Values close to 0.5 are considered optimized designs.

Optimization Considerations for the Printheads of FIGS. 2B and 4B

Figure 9:
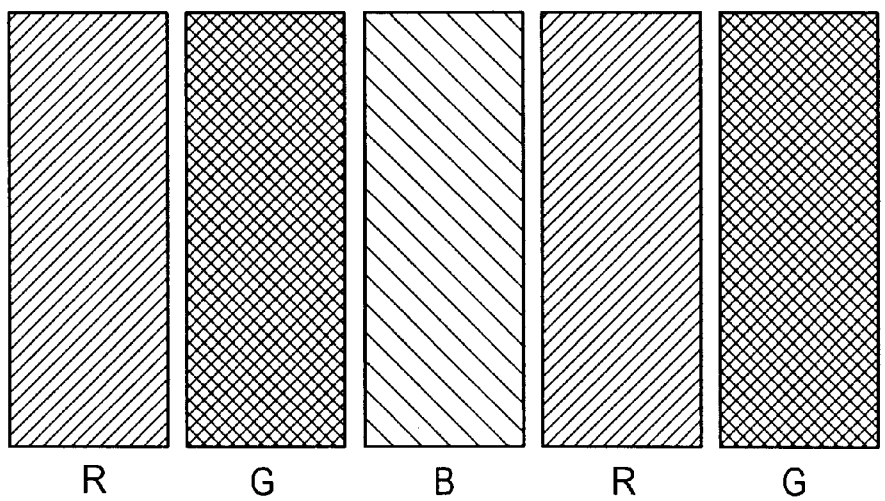
FIG. 9 depicts, for the printheads of FIGS. 2B and 4B, the calculated intensities for the three wavelength ranges of the triplet, as well as the crosstalk and the point spread function due to elements emitting in the same wavelength range.
Figure 9:
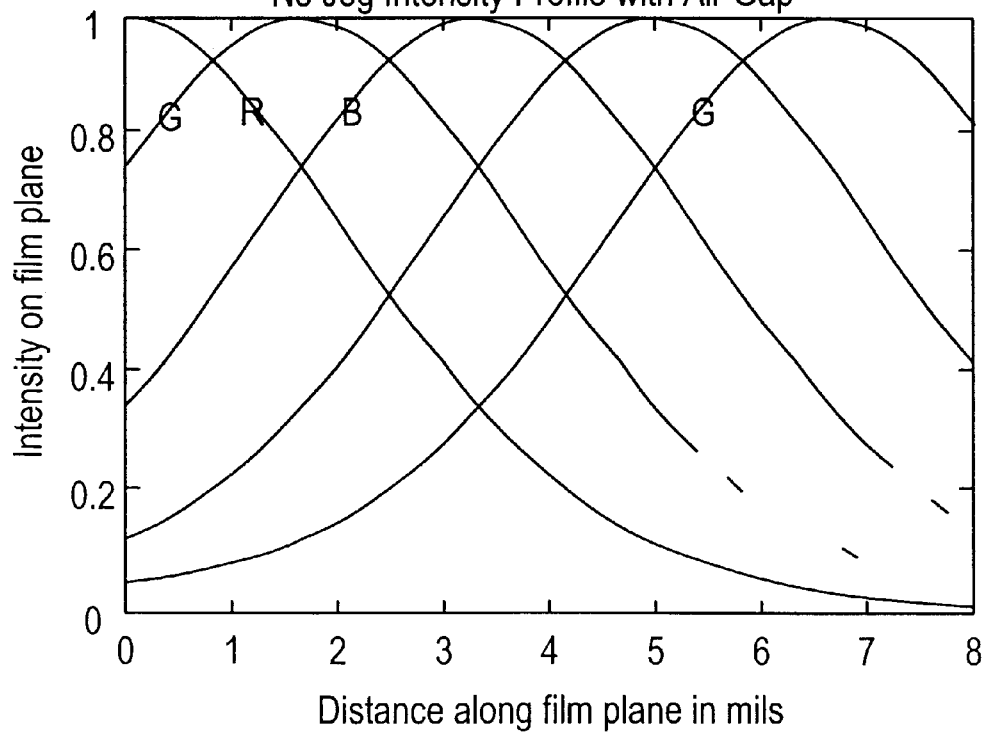

In the case where each OLED array is comprised of a plurality of triplets of OLED elements (FIGS. 2B and 4B), the calculations of pixel sharpness and crosstalk proceed as above except that they are carried out for the elements emitting in the same wavelength range (for example, the elements emitting in the red, or in the green. or in the blue). One additional consideration is the overlap of intensities from different wavelength ranges. This overlap results in a slight loss in color gamut. The intensities for the three wavelength ranges of the triplet, as well as the crosstalk and the point spread function due to elements emitting in the same wavelength range, can be seen in FIG. 9.

Sample Calculations

Photosensitive Medium (Film) 2

For a Photosensitive medium (film) with the properties given in Table 1,

TABLE 1

Sensitivity Of Film 2.

| Sensitivity | Joules/cm² |
|---|---|
| Red, Green or Blue | $1.0 \times 10^{-8}$ | and a printhead as shown in FIGS. 2A or 4A with the parameters given in Table 2, the SQF as a function of air gap thickness is shown in the Table 3 and the crosstalk is given in FIG. 8.

TABLE 2

OLED Printer Parameters For The Case Of Film 2.

| OLED printer parameters | | |
|---|---|---|
| DPI | 200 | |
| d(Characteristic dimension of OLED = 2*$_d$) | 2.4 | mils |
| Distance between the centers of any two OLED elements | 5.0 | mils |
| Index of refraction of the OLED substrate or cover | 1.485 | |

TABLE 3

Pixel SQF As A Function Of Filter Cover Thickness, Air Gap And Film Cover Thickness

| | | | |
|---|---|---|---|
| OLED Cover Refractive Index | 1.48 | 1.48 | 1.48 |
| OLED Cover Thickness (mils) | .5 | .5 | .5 |
| Mask (air gap) Thickness (mils) | 1.6 | .5 | 1.6 |
| Film Cover Sheet Thickness (mils) | 3.0 | 3.0 | 2.0 |
| SQF (pixel) | 95.0 | 96.7 | 96.0 |

Thus, embodiments have been disclosed that provide a printhead that is light weight and compact, where an OLED structure is deposited onto a substrate and, printhead is designed for contact or quasi-contact printing, without additional optical elements, with the desired pixel sharpness and reduced crosstalk.

Other embodiments of the invention, including combinations, additions, variations and other modifications of the disclosed embodiments will be obvious to those skilled in the art and are within the scope of the following claims.

What is claimed is:

1. An apparatus for exposing a photosensitive material, said photosensitive material having a light receiving surface and being exposed by radiation impinging on said light receiving surface, said apparatus comprising:

a substrate having a substantially planar first surlace oppositely spaced apart from a substantially planar second surface, wherein said substrate has a given thickness as measured between said first and second planar surfaces; and an individually addressable Organic Light Emitting Diode (OLED) structure, said structure comprising at least one elongated array of individually addressable Organic Light Emitting Diode (OLED) elements including a transparent anode layer through which exposure light is adapted to be transmitted, said Organic Light Emitting Diode (OLED) structure being deposited in sequential layers onto the first surface of said substrate wherein said transparent anode layer is spaced furthest away from the first surface of said substrate; and a substantively transparent layer deposited onto the OLED structure, said transparent layer having a light receiving surface in effective light transmission relation to the transparent anode and a light emitting surface oppositely spaced apart from the transparent layer light receiving surface, wherein the thickness of said transparent layer, as measured between its said light receiving and emitting surfaces, is substantially less than the given thickness of said substrate so that when said light emitting surface of said transparent layer is brought into proximity to the light receiving surface of the photosensitive material, the distance between light emitting elements of the Organic Light Emitting Diode (OLED) structure and the photosensitive material is minimized to enhance pixel sharpness and reduce crosstalk.

2. The apparatus of claim 1 further comprising:

a plurality of driver control circuits for selectively controlling the energizing of said Organic Light Emitting Diode (OLED) elements and controlling; and means of electrically connecting selected ones of said individually addressable light emitting elements in said OLED structure to said selected ones of said driver control circuits.

3. The apparatus of claim 2 wherein said at least one array is comprised of a plurality of triplets of OLED elements, and each element in each said triplet being capable of emitting radiation in a distinct wavelength range different from the other two elements in the same triplet.

4. The apparatus of claim 3 wherein said OLED structure is an actively addressable OLED structure.

5. The apparatus of claim 3 wherein said OLED structure is a passively addressable OLED structure.

6. The apparatus of claim 2 comprising at least one of plurality of triplets of said elongated arrays of individually addressable Organic Light Emitting Diode (OLED) elements, each array in the triplet being aligned in substantially parallel spaced relation with respect to each other array in the triplet, each array in each triplet being capable of emitting radiation in a distinct wavelength range different from the distinct wavelength range of the other two anays in the triplet, each triplet being aligned in substantially parallel spaced relation with respect to any other array triplet.

7. The apparatus of claim 6 wherein said OLED structure is an actively addressable OLED structure.

8. The apparatus of claim 6 wherein said OLED structure is a passively addressable OLED structure.

9. The apparatus of any of claim 1 or claims 3–8 wherein the planar light emitting surface of the transparent layer is oppositely spaced apart at a given distance from and substantively parallel to the light receiving surface of said photosensitive material, and any OLED element has characteristic surface dimensions which are substantially the same for all OLED elements and from which a center point can be defined, the Organic Light Emitting Diode (OLED) elements in any of the arrays are spaced apart by a given spacing between centers of the OLED elements, and the radiation originating from any OLED element in any said array and impinging on said light receiving surface of said photosensitive material defines a pixel area on the light receiving surface of said photosensitive material, said pixel area having a characteristic pixel dimension, said distance between the planar light emitting surface of the transparent layer and the light receiving surface of photosensitive material, said spacing between centers of the OLED elements, said spacing between the light emitting surface and the light receiving surface of the transparent layer, and said characteristic surface dimension of the OLED elements being jointly selected so that, at a given pixel area, said pixel area corresponding to a given OLED element in a given array, the exposure of said photosensitive material due to the light intensity from the elements of the given array which are adjacent to the given element, is optimized.

10. The apparatus of any of claims 3–8 wherein any OLED element has characteristic surface dimensions which are substantially the same for all OLED elements and from which a center point can be defined, each said center point having a corresponding image point at the light emitting surface of said substrate, each said image point being the center point of an area having the same surface dimensions as that of any OLED element and being aligned with the corresponding OLED center point, and wherein every said area further comprises a region substantially adjoining the entire periphery of said area, and said region substantively absorbing radiation in all three distinct wavelength ranges, each said distinct wavelength range being associated with an OLED in a said triplet.

11. The apparatus of claim 10 wherein said region substantially adjoining the entire periphery of said area is formed by depositing a material by deposition means, said material absorbing radiation in all said three distinct wavelength ranges.

12. The apparatus of claim 10 wherein the planar light emitting surface of the transparent layer is oppositely spaced apart at a given distance from and substantively parallel to the light receiving surface of said photosensitive material, and any OLED element has characteristic surface dimensions which are substantially the same for all OLED elements and from which a center point can be defined, the Organic Light Emitting Diode (OLED) elements in any of the arrays are spaced apart by a given spacing between centers of the OLED elements, and the radiation originating from any OLED element in any said array and impinging on said light receiving surface of said photosensitive material defines a pixel area on the light receiving surface of said photosensitive material, said pixel area having a characteristic pixel dimension, said distance between the planar light emitting surface of the substrate and the light receiving surface of photosensitive material, said spacing between centers of the OLED elements, said spacing between the light emitting surface and the light receiving surface of the transparent layer, and said characteristic surface dimension of the OLED elements being jointly selected so that, at a given pixel area, said pixel area corresponding to a given OLED element in a given array, the exposure of said photosensitive material due to the light intensity from the elements of the given array which are adjacent to said given OLED element and from said given OLED element, is optimized.

13. The apparatus of any of claims 3–8 further comprising a layer of imageable material deposited upon the light emitting surface of said transparent layer, said imageable layer having an imageable layer light receiving surface oppositely spaced apart from and substantively parallel to an imageable layer light emitting surface, said imageable layer light receiving surface in effective light transmission relation to the light emitting surface of said transparent layer.

14. The apparatus of claim 13 wherein any OLED element has a characteristic surface dimension which is substantially the same for all OLED elements and from which a center point can be defined, each said center point having a corresponding image point at the light emitting surface of said imageable layer, each said image point being the center point of an area having the same surface dimensions as that of any OLED element and being aligned with the corresponding OLED center point, and wherein every said area further comprises a region substantially adjoining the entire periphery of said area, and said region substantively absorbing radiation in all three distinct wavelength ranges, each said distinct wavelength range being associated with an OLED in a said triplet, and said region being formed by imaging said imageable material.

15. The apparatus of claim 14 wherein the planar light emitting surface of the imageable layer is oppositely spaced apart at a given distance from and substantively parallel to the light receiving surface of said photosensitive material, and any OLED element has characteristic surface dimensions which are substantially the same for all OLED elements and from which a center point can be defined, the Organic Light Emitting Diode (OLED) elements in any of the arrays are spaced apart by a given spacing between centers of the OLED elements, and the radiation originating from any OLED element in any said array and impinging on said light receiving surface of said photosensitive material defines a pixel area on the light receiving surface of said photosensitive material, said pixel area having a characteristic pixel dimension, said distance between the planar light emitting surface of the imageable layer and the light receiving surface of photosensitive material, said spacing between centers of the OLED elements, said spacing between the light emitting surface and the light receiving surface of the transparent layer, and said characteristic surface dimension of the OLED elements being jointly selected so that, at a given pixel area, said pixel area corresponding to a given OLED element in a given array, the exposure of said photosensitive material due to the light intensity from the elements of the given array which are adjacent to said given OLED element and from said given OLED element, is optimized.

16. A method of exposing a photosensitive material, said material having a light receiving surface, utilizing a printhead, said printhead comprising at least one of a plurality of triplets of elongated arrays of individually addressable Organic Light Emitting Diode (OLED) elements, each array in each triplet being capable of emitting radiation in a distinct wavelength range different from the distinct wavelength range of the other two arrays in the triplet, said arrays being equally spaced apart by a given array spacing distance, said method comprising the steps of:

placing the printhead over the photosensitive material such that the light emitting surface of the printhead is oppositely spaced apart at a given distance from and substantively parallel to the light receiving surface of the photosensitive material; and addressing and printing the elements of the array,, in all the triplets; then, displacing the printhead relative to the photosensitive material by said given array spacing distance in the direction perpendicular to both the distance between the printhead and the light receiving surface of the photosensitive material and the direction along the array so that the array in the triplet that emits in the second distinct wavelength range is located substantively at the position previously occupied by the array which emits in the first distinct wavelength range; then, addressing and printing the elements of the arrays in all the triplets; then, displacing the printhead relative to the photosensitive material by said given array spacing distance in the direction perpendicular to both the distance between the printhead and the light receiving surface of the photosensitive material and the direction along the array so that the array in the triplet that emits in the third distinct wavelength range is located substantively at the position previously occupied by the array which emits in the second distinct wavelength range and initially occupied by the array which emits in the first distinct wavelength range; then, addressing and printing the elements of the arrays in all the triplets.

* * * * *